United States Patent
Winters et al.

(10) Patent No.: US 12,196,667 B2
(45) Date of Patent: Jan. 14, 2025

(54) PHYSICAL OBJECT PROCESSING SYSTEM AND METHOD

(71) Applicant: Nederlandse Organisatie voor toegepast-natuurwetenschappelijk onderzoek TNO, 's-Gravenhage (NL)

(72) Inventors: Jasper Winters, Nieuw-Vennep (NL); Robert Snel, Delft (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 245 days.

(21) Appl. No.: 17/924,441

(22) PCT Filed: May 18, 2021

(86) PCT No.: PCT/NL2021/050319
§ 371 (c)(1),
(2) Date: Nov. 10, 2022

(87) PCT Pub. No.: WO2021/235933
PCT Pub. Date: Nov. 25, 2021

(65) Prior Publication Data
US 2023/0184667 A1 Jun. 15, 2023

(30) Foreign Application Priority Data
May 18, 2020 (EP) .................................. 20175255

(51) Int. Cl.
*G01N 21/01* (2006.01)
*G02B 5/09* (2006.01)
(Continued)

(52) U.S. Cl.
CPC ............ *G01N 21/01* (2013.01); *G02B 5/09* (2013.01); *G02B 7/1827* (2013.01); *H04N 23/56* (2023.01);
(Continued)

(58) Field of Classification Search
CPC .. G01N 21/01; G01N 2021/845; H04N 23/56; H04N 23/64; G02B 5/09; G02B 7/1827
See application file for complete search history.

(56) References Cited

U.S. PATENT DOCUMENTS

2018/0252936 A1* 9/2018 Owens ................. G02B 26/101

FOREIGN PATENT DOCUMENTS

| EP | 0682991 A2 | 11/1995 |
|---|---|---|
| JP | H0895125 A | 4/1996 |

OTHER PUBLICATIONS

European Patent Office, International Search Report in corresponding International Application No. PCT/NL2021/050319, dated Sep. 10, 2021 (3 pages).

* cited by examiner

*Primary Examiner* — Jamil Ahmed
(74) *Attorney, Agent, or Firm* — Leydig, Voit & Mayer, Ltd.

(57) ABSTRACT

A physical object processing system is described that includes a process station, a transport facility, an optical imaging system, an image sensor and data process facilities. The transport facility transports objects along the process station that performs processing steps to the object. The image sensor acquires a digital image from an optical image of the physical objects provided by the optical imaging system. The data process facilities in turn process the digital image to control the process station. The optical imaging system maps the optical image of the at least one physical object onto the image sensor at an at least substantially fixed position during a time-interval for acquiring the digital image.

20 Claims, 10 Drawing Sheets

(51) Int. Cl.
*G02B 7/182* (2021.01)
*H04N 23/56* (2023.01)
*H04N 23/60* (2023.01)
*G01N 21/84* (2006.01)

(52) U.S. Cl.
CPC ....... *H04N 23/64* (2023.01); *G01N 2021/845* (2013.01)

PHYSICAL OBJECT PROCESSING SYSTEM AND METHOD

CROSS-REFERENCE TO RELATED APPLICATIONS

This patent application is a U.S. National Phase of PCT International Application No. PCT/NL2021/050319, filed May 18, 2021, which claims priority to European Application No. 20175255.7, filed May 18, 2020, which are both expressly incorporated by reference in their entireties, including any references contained therein.

BACKGROUND

The present disclosure relates to a physical object processing system.

The present disclosure relates to a physical object processing method.

Image processing techniques are suitable to properly control production processes applied to physical objects. Examples of such production processes are deposition on substrates, patterning of structures into substrates, placement of components on substrates and inspection of structures on substrates.

Such production techniques can be applied while the physical object is moving. This is advantageous as this enables a continuous production process. However, if the speed with which the object moves is increased too much, this may result in motion blur in the captured image to the extent that accurate object coordinates cannot be determined from the captured image. It may be contemplated to mitigate motion blur when imaging moving objects by reducing the camera shutter time. However, in practice, a substantial reduction of the shutter time is not possible or at least extremely expensive. The shortest shutter time for commercially available cameras is in the order of 30 microseconds, whereas a substantially shorter shutter time (i.e. in the order of a microsecond) would be required.

Accordingly there is a need to provide images of moving objects having an at least substantially reduced motion blur at modest costs.

SUMMARY

In order to address the need specified above, the present disclosure provides an improved physical object processing system as claimed in claim 1.

The improved physical object processing system comprises a process station, a transport facility, an optical imaging system and data process facilities.

The process station is configured to perform processing steps to at least one physical object. In one example the process station is configured to deposit a material onto a surface of the object, for example to form an electrical interconnection, to pattern a structure into a substrate, to pick and/or place a component on a substrates or to inspect a structure on a substrate.

The transport facility is configured to transport the at least one physical object along the process station.

The optical imaging system is configured to map an optical image of the at least one physical object onto an image sensor. The image sensor is configured to acquire a digital image of the mapped optical image. The data process facilities are configured to process the acquired digital image and to accordingly control the process station.

The improved physical object processing system is characterized in that the optical imaging system is configured to map the optical image of at least one physical object onto the image sensor at an at least substantially fixed position during a time-interval for acquiring the digital image. Due to the fact that the optical image of the object is temporarily fixed, a digital image wherein motion blur is at least substantially mitigated can be acquired by the image sensor even if it has a relatively large shutter time. For simplicity an image having no motion blur or an image wherein motion blur is at least substantially mitigated is denoted further in the description as an image without motion blur.

Various options are available with respect to the range where the at least one physical object is relative to the processing station when it is mapped as an optical image onto the image sensor. In an embodiment, the optical imaging system is configured to map the optical image of the at least one physical object when it is stream upwards of the process station. In this embodiment, the data processing facilities can use the digital image data as an input to control an operation of the process station in a feed-forward manner. The processing of the digital image may for example reveal that the physical object is offset with respect to an expected position, and the operation of the process station may be controlled to accordingly adapt the processing location, e.g. a location where it deposits a functional material.

In another embodiment, the optical imaging system is configured to map the optical image of the at least one physical object when it is stream downwards of the process station. Whereas this does not allow a feedforward control, it still renders possible a feedback adaptation, for example an adaptation of the process station to a gradual drift of subsequent objects respective to reference position. Also the digital image data obtained therewith are suitable to derive information about the operation of the processing station itself, e.g. a morphology of the deposited material is analyzed to control a setting of a functional material deposition station.

In a still further embodiment, the optical imaging system is configured to map the optical image of the at least one physical object when it is within a range of the process station. This embodiment may be more complicated to implement as the processing station may partly obscure the object. This embodiment may be valuable however in that the acquired digital image further may provide information about the course of the process carried out by the process station.

Typically the at least one physical object is one of a series of physical objects that are one by one transported along the processing station. Typically, the processing station is one of a plurality of processing stations that each perform a specific operation, for example deposit respective device layers. In that case the transport facility, e.g. a conveyor belt transports each of the objects along each of the process stations. This requires that the exemplary operations are performed repetitively, e.g. repetitively depositing on a substrate, repetitively patterning of structures into substrates, repetitively placing components on substrates and repetitively inspecting structures on substrates An embodiment of the physical object processing system further comprises a translation actuator to translate the image sensor and the optical imaging system in a direction corresponding to the direction wherein the at least one object is transported. An actuator controller controls the translation actuator in accordance with a speed with which the object moves. The image sensor and its optical imaging system may therewith follow the object under consideration during a time interval wherein the shutter is opened, so that a digital image without motion blur is acquired. Subsequently the actuator controller can control the translation actuator to move to the position of a next object to follow. In some embodiments the image sensor follows a plurality of objects in its view at the same time.

In an alternative embodiment the optical imaging system comprises a rotatable mirror, a mirror rotation actuator to rotate the rotatable mirror and an actuator controller that controls the mirror rotation actuator in accordance with a speed with which the object moves. It is an advantage of this embodiment that back and forth translations can be avoided. Furthermore the total amount of moving parts is strongly reduced. Apart from the rotating mirror, the remainder of the optical imaging system can be held at a fixed position. Therewith system reliability and maintainability is clearly improved. In some embodiments the rotating mirror is a two-sided mirror. In other embodiments the rotatable mirror is a polygonal mirror.

In some embodiments, the optical imaging system comprises in addition to the rotatable mirror a further rotatable mirror controlled by a proper further mirror actuator, wherein the further mirror actuator is configured to control the further rotatable mirror as part of a feedback path having a relatively high response frequency as compared to that comprising the rotatable mirror. The rotatable mirror may be provided for example to rotate at a relatively constant speed to compensate for movements that are associated with constant movement of the transport facility. The further rotatable mirror is to respond at high speed to any remaining deviations. In examples thereof, the actuator controller operates on the basis of an input signal from the sensor that senses the motion of the transport facility and the further controller operates on the basis of in input signal from the feedback unit that uses the output signal from the object detection unit. In some embodiments, the further mirror actuator is configured to correct for errors in the same direction as mirror actuator as well as a second direction perpendicular thereto.

In some embodiments the actuator that translates the image sensor and the optical imaging system at a predetermined translation speed or the actuator that rotates the mirror operates at a predetermined rotation speed, which is based on a predetermined information about an object transport speed. In improved embodiments, the physical object processing system comprises a sensor to provide to the actuator controller a sense signal indicative for one or more of a position, a speed and an acceleration of the transport facility. In some of these improved embodiments the physical object processing system comprises an object detection unit to generate an output signal indicative for a displacement speed of the optical image of the at least one physical object mapped onto the image sensor and a feedback unit using said output signal to enable the actuator controller to minimize said displacement speed. In some examples of these improved embodiments, the object detection unit is further configured to generate the output signal with an indication for a mapping location of the optical image of the at least one physical object. The feedback unit uses said output signal to enable the actuator controller to minimize a deviation of the mapping location from a predetermined mapping location.

In some embodiments the actuator controller is configured to provide an image sensing trigger signal that indicates a time interval wherein the optical imaging system is capable to map a stable optical image of the at least one object. In order to compensate the movement of the object, the mirror has to be continuously rotated. When using a polygonal mirror a discontinuity occurs if a next mirror element takes the place of the previous one as the one that actually maps the object to the image sensor. With this measure image acquisition can take place in a time interval between mutually subsequent discontinuities.

In some embodiments of the physical object processing system the object detection unit and the speed sensor provide a first and a second input clock signal and the physical object processing system further comprises a clock management unit which generates an output clock signal on the basis of a low frequency component in the first input clock signal and a high frequency component in the second input clock signal. Therewith an output clock signal can be obtained that is more accurate than each of the first and the second input clock signal. The low-frequency component of the first input signal is for example obtained with a low-pass filter having an above cut-off frequency with a predetermined frequency value and the high-frequency component of the second input signal is for example obtained with a high-pass filter having an below cut-off frequency with that same predetermined frequency value that is for example in the range of 100 Hz to a few hundreds of Hz, e.g. a predetermined frequency value of 200 Hz. It is not necessary that the filters have a very sharp roll-off characteristic, e.g. the low-pass filter and the high pass filter may for example have a first-order roll-off characteristic.

In some embodiments of the physical object processing system the data process facilities comprise a high bandwidth infrastructure capable of transporting data concurrently with minimal delay between consequtive processing stages. This can be implemented via Direct Memory Access as such that processing units are able to access the memory of adjacent units. The data process facilities therewith have a short latency, which enables the controlloop to attain a high control bandwidth. Examples thereof are repetitive picking from diced wafers or substrates, repetitive deposition on substrates, repetitive patterning of structures into substrates, repetitive placement of components on substrates and repetitive inspection of structures on substrates.

Analogously the present disclosure addresses this need with an improved physical object processing method as claimed in claim 16.

BRIEF DESCRIPTION OF THE DRAWINGS

These and other aspects are described in more detail with reference to the drawings. Therein.

DETAILED DESCRIPTION OF EMBODIMENTS

Like reference symbols in the various drawings indicate like elements unless otherwise indicated.

Figure 1:
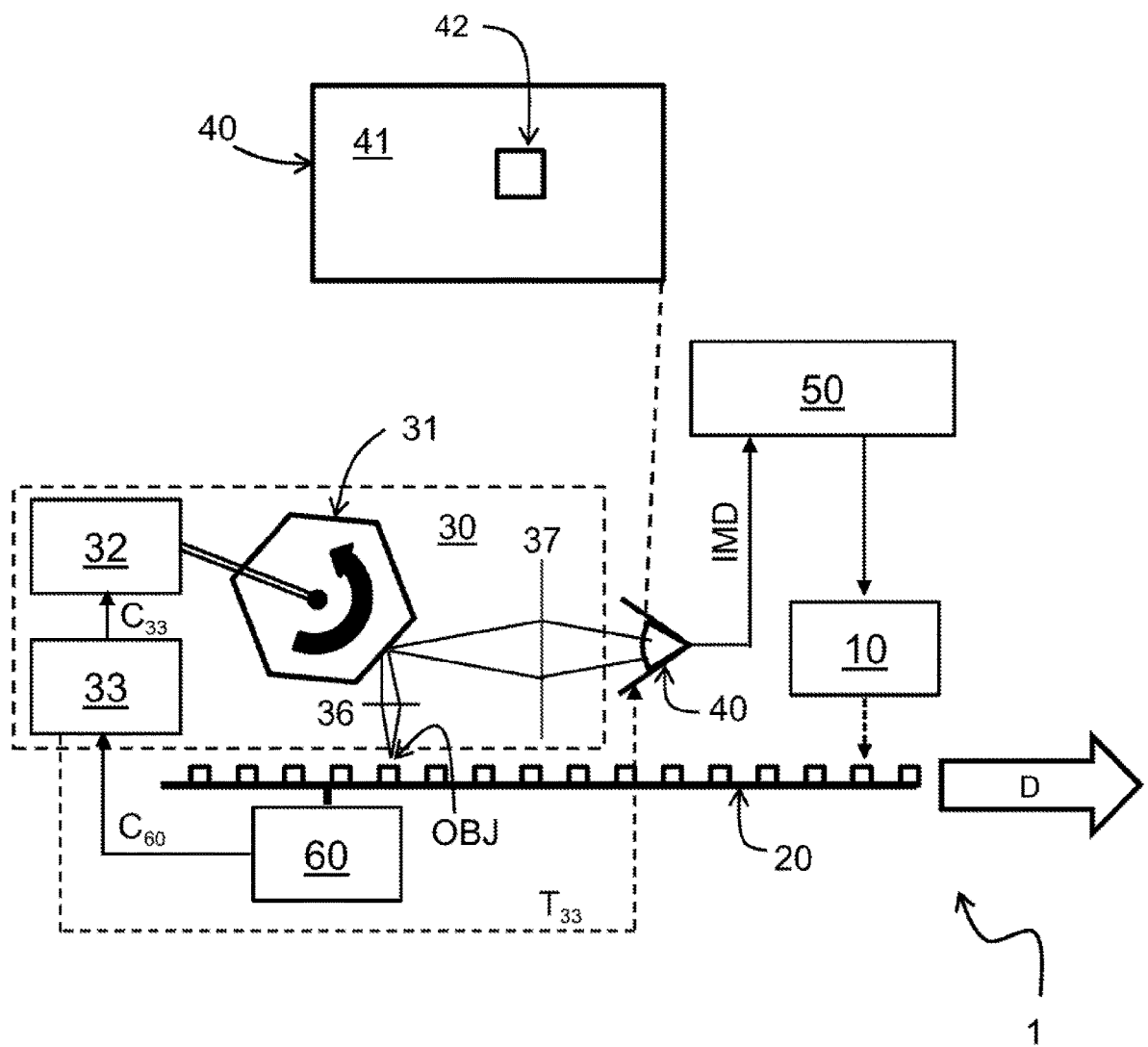
FIG. 1 shows a first embodiment of an improved physical object processing system.

FIG. 1 schematically shows a first embodiment of the improved physical object processing system 1. The physical object processing system 1 comprises a process station 10, a transport facility 20, an optical imaging system 30, an image sensor 40 and data process facilities 50.

In operation, the process station 10 performs processing steps to physical objects, of which one is specifically denoted as OBJ, that are transported along the process station 10 by the transport facility 20. Typically the transport facility 20 is a conveyer belt, but in other embodiments the transport facility is a robot arm for example. The process station 10 typically performs the process steps in a contact free manner, e.g. by depositing a substance on the physical object OBJ or by irradiating the physical object.

In operation the optical imaging system 30 maps an optical image 42 of the at least one physical object OBJ onto an image plane 41 of the digital image sensor 40 and the latter is configured to acquire a digital image IMD representative for the optical image. The data process facilities 50 process the digital image IMD and control the process station 10 in accordance with the process results, for example to align the process station with an position of the object OBJ estimated by the data process facilities 50.

The optical imaging system 30 of the improved physical object processing system 1 is configured to map the optical image 42 of the physical object onto the image plane 41 of the image sensor at an at least substantially fixed position during a time-interval for acquiring the digital image. This renders it is possible to obtain a digital image without motion blur even if the transport speed with which the object OBJ moves is relatively high and the digital image sensor 40 has a relatively long shutter time. In the embodiment shown this is achieved in that the optical imaging system 30 comprises a rotatable mirror 31, a mirror rotation actuator 32 to rotate the rotatable mirror and an actuator controller 33 that controls the mirror rotation actuator in accordance with a speed with which the object OBJ moves. In the example shown the optical imaging system 30 comprises a first lens unit 36 that maps an optical image of the object OBJ onto the rotatable mirror 31 and a second lens unit 37 that finally provides the optical image 42 on the image plane 41 of the sensor 40. In the embodiment shown in FIG. 1, the rotatable mirror 31 is a polygonal mirror, specifically a hexagonal mirror. Alternatively an other type of rotatable mirror may be used, for example a two-sided plane mirror.

In the embodiment shown in FIG. 1, the physical object processing system 1 comprises a sensor 60 to provide to the actuator controller 33 a sense signal $C_{60}$ that is indicative for one or more of a position, a speed and an acceleration of the transport facility 20. The sensor is for example provided as a position metrology system, such as a linear encoder or interferometer.

Figure 2:
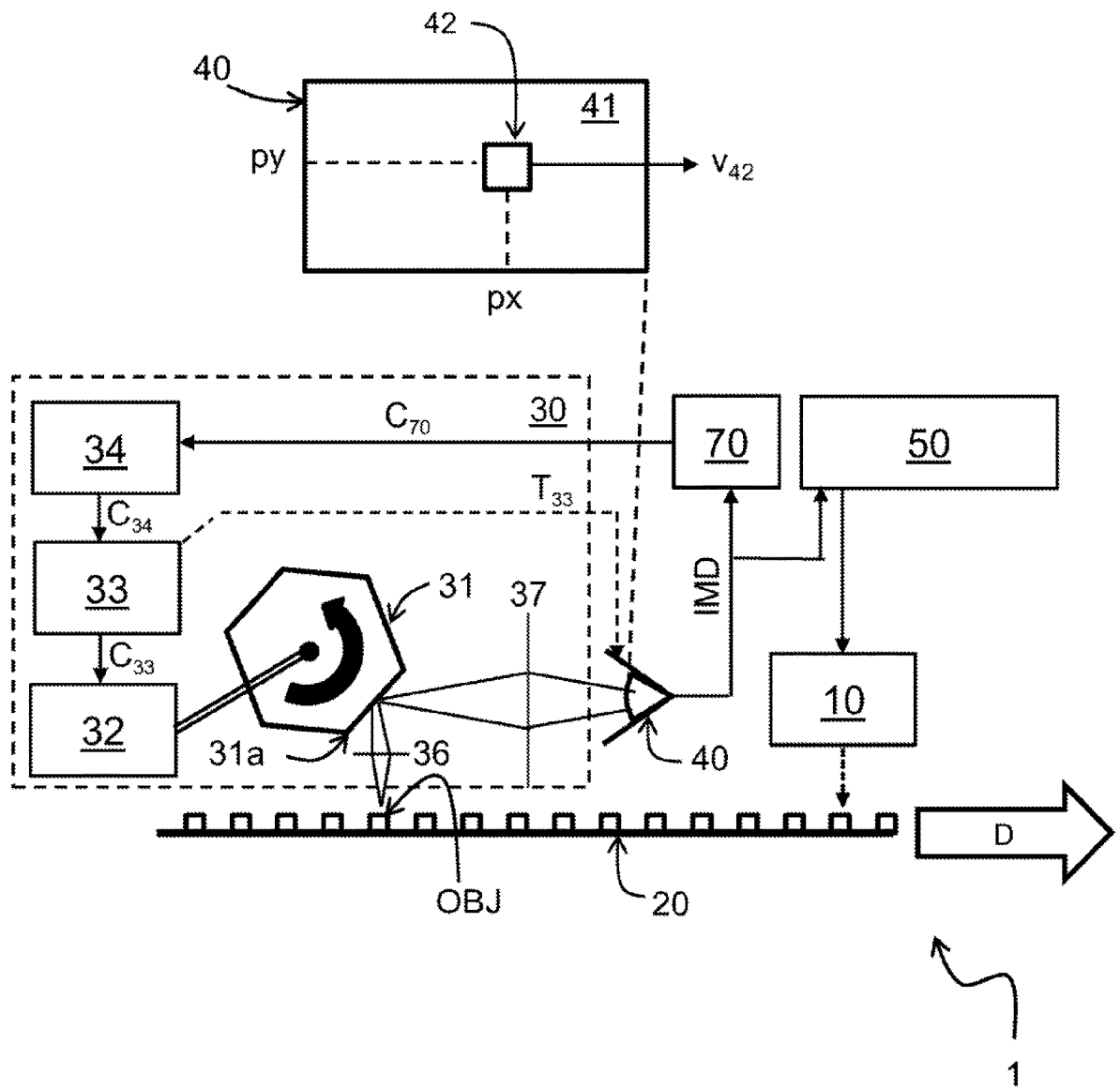
FIG. 2 shows a second embodiment of an improved physical object processing system.

FIG. 2 shows a second embodiment of the improved physical object processing system 1. In this second embodiment, the physical object processing system 1 comprises an object detection unit 70 to generate an output signal $C_{70}$ that is indicative for a displacement speed $v_{42}$ of the optical image 42 of the at least one physical object OBJ mapped onto the image sensor 40. Furthermore a feedback unit 35 is provided that uses the output signal $C_{50}$ to enable the actuator controller 33 to minimize the displacement speed of the optical image. In some examples, the object detection unit 70 is further configured to generate the output signal $C_{70}$ with an indication for a mapping location (px, py) of the optical image of the object. In these examples, the feedback unit 34 uses the output signal to enable the actuator controller 33 to minimize a deviation of the mapping location from a predetermined mapping location. In the embodiment shown in FIG. 2, the actuator controller 33 is configured to provide an image sensing trigger signal $T_{33}$ that indicates a time interval wherein the optical imaging system 30 is capable to map a stable optical image 42 of the at least one object OBJ. The image sensing trigger signal $T_{33}$ may for example indicate the point in time when a vertex 31a of the polygonal mirror 31 has just passed the location where the object OBJ is mapped by the lens unit 36 on the polygonal mirror 31. In the embodiment shown additional data process facilities 50 are provided to analyze the image data IMD and to provide control data for the process station 10.

Figure 3:
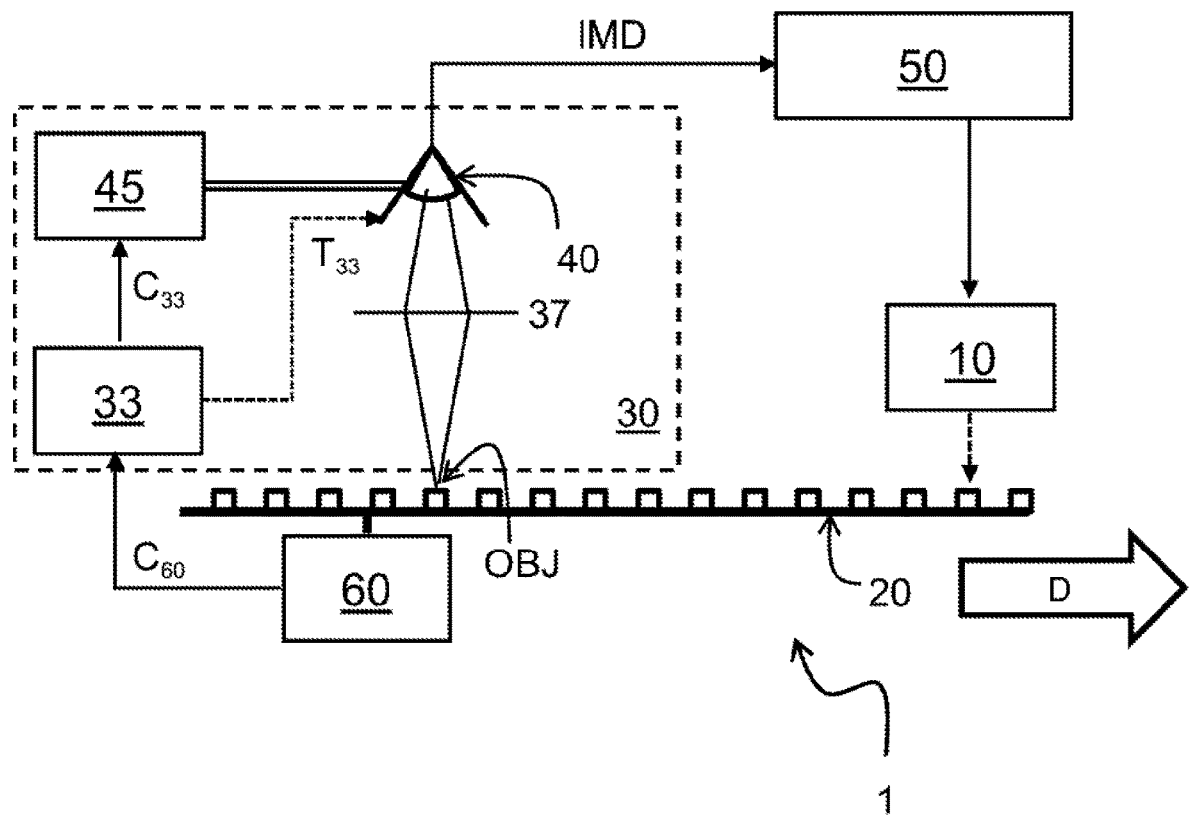
FIG. 3 shows a third embodiment of an improved physical object processing system.

The embodiment of the physical object processing system 1 shown in FIG. 3 comprises a translation actuator 45 to translate the image sensor 40 and the optical imaging system 37 in a direction corresponding to the direction wherein the objects OBJ are transported. This embodiment does not need low latency processing (FIG. 1,6 neither). If higher latency is allowed, the throughput may be solved with concurrent processing systems. The actuator controller 33 controls the translation actuator 45 in accordance with a speed with which the objects OBJ move in order to map the optical image of the at least one physical object onto the image sensor 40 at an at least substantially fixed position during a time-interval for acquiring the digital image. To that end the actuator controller 33 aims to move the image sensor 40 and its optical imaging system 37 to mitigate a motion of the object image. This can for example be the case in that the speed of movement is the same speed as that of the objects OBJ which are transported. Alternatively the image sensor may rotate to constrain the object-image at a fixed position or it may perform a combination of a rotation and a translation for this purpose. Alternatively, it may be contemplated to mitigate object image motions by a rotation of the sensor and its imaging system. At the end of the actuation range of the actuator 45 the image sensor 40 and its optical imaging system 37 are moved back to a start position to start a subsequent imaging cycle. In some embodiments a single object is imaged in each imaging cycle. In other embodiments the image sensor 40 may follow a group of objects OBJ during an imaging cycle.

In some embodiments the at least substantially fixed position controlled with the actuator controller 33 is a predetermined position px, py on the image plane 41 of the image sensor. In the embodiment shown in FIG. 3, a sensor 60 is provided that issues a sense signal $C_{60}$ to the actuator controller 33. The sensor 60 is for example a position metrology device (e.g. linear encoder or interferometer. The sense signal is indicative for one or more of a position, a speed and an acceleration of the transport facility 20.

The actuator controller 33 provides an image sensing trigger signal $T_{33}$ that indicates a time interval wherein the optical imaging system 30 is capable to map a stable optical image 42 of the at least one object OBJ. The image sensing trigger signal $T_{33}$ may indicate a point in time shortly after the point in time where it returned to its start position and when actuator 45 is properly synchronized with the transported objects, so that the speed of the object image 42 in the plane 41 of the image sensor 40 is sufficiently low, and preferably a position of the object image 42 in that plane 41 is sufficiently close to a reference position. Alternatively the actual position of the object image may differ if the operation of the data process facility 50 is insensitive to the position, for example if the data process facility 50 only needs to identify a shape of an object feature.

Figure 4:
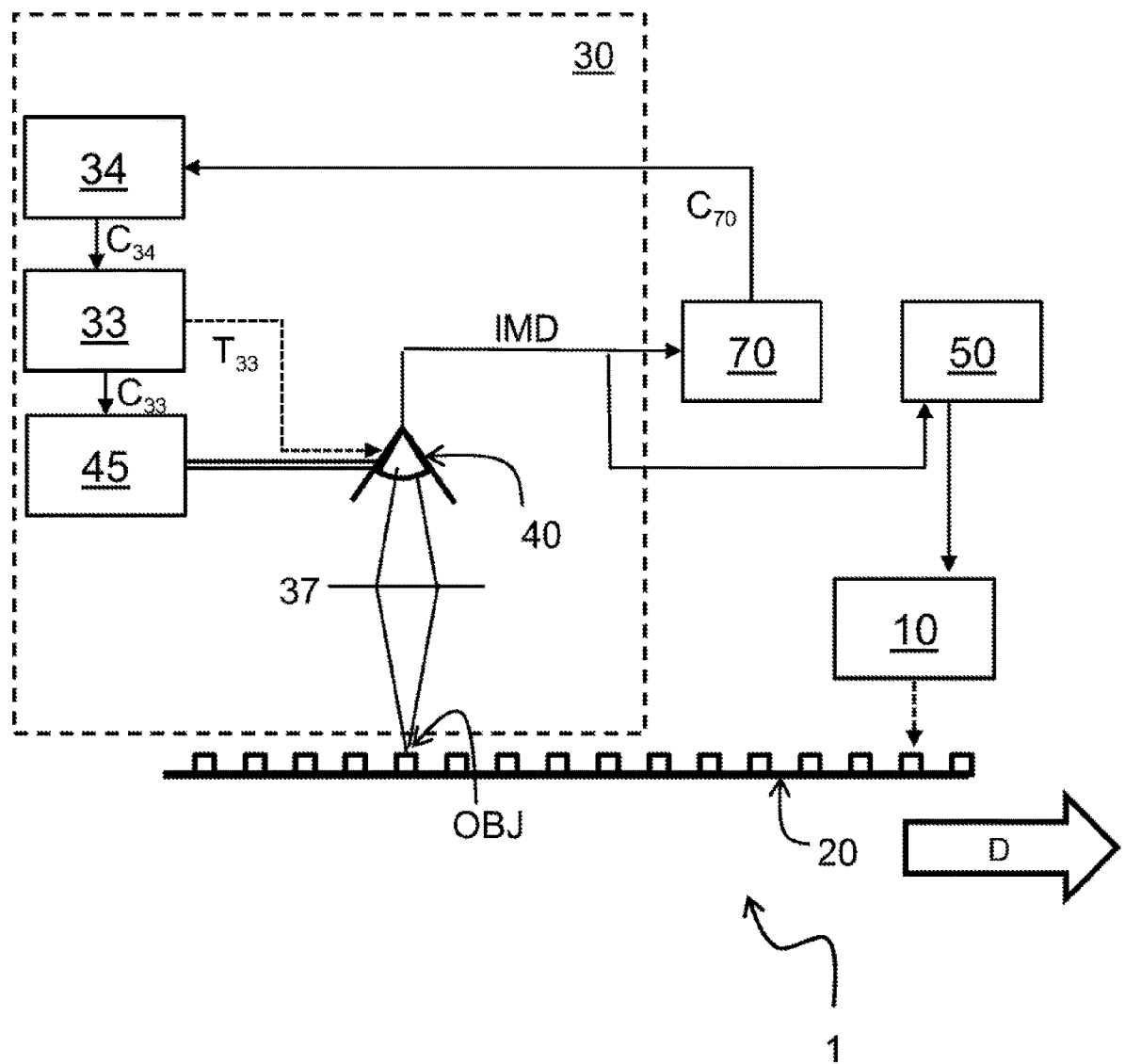
FIG. 4 shows a fourth embodiment of an improved physical object processing system.

FIG. 4 shows a further embodiment of the physical object processing system 1. Similar as in the embodiment of FIG. 3, the physical object processing system 1 comprises a translation actuator 45 to translate the image sensor 40 and the optical imaging system 37 in a direction corresponding to the direction wherein the objects OBJ are transported. Likewise the actuator controller 33 controls the translation actuator 45 in accordance with a speed with which the objects OBJ move in order to map the optical image of the at least one physical object onto the image sensor 40 at an at least substantially fixed position during a time-interval for acquiring the digital image. Contrary to this previous embodiment the physical object processing system 1 comprises an object detection unit 50 to generate an output signal $C_{50}$ indicative for a displacement speed of the optical image 42 of a physical object OBJ mapped onto the image sensor 40 and a feedback unit 34 that uses the output signal $C_{50}$ to enable the actuator controller 33 to minimize said displacement speed. In the embodiment shown, the object detection system 50 used for this purpose is the same as the one used to process the digital image IMD and to accordingly control the process station 10. This is advantageous in that processing facilities are efficiently used.

Figure 5:
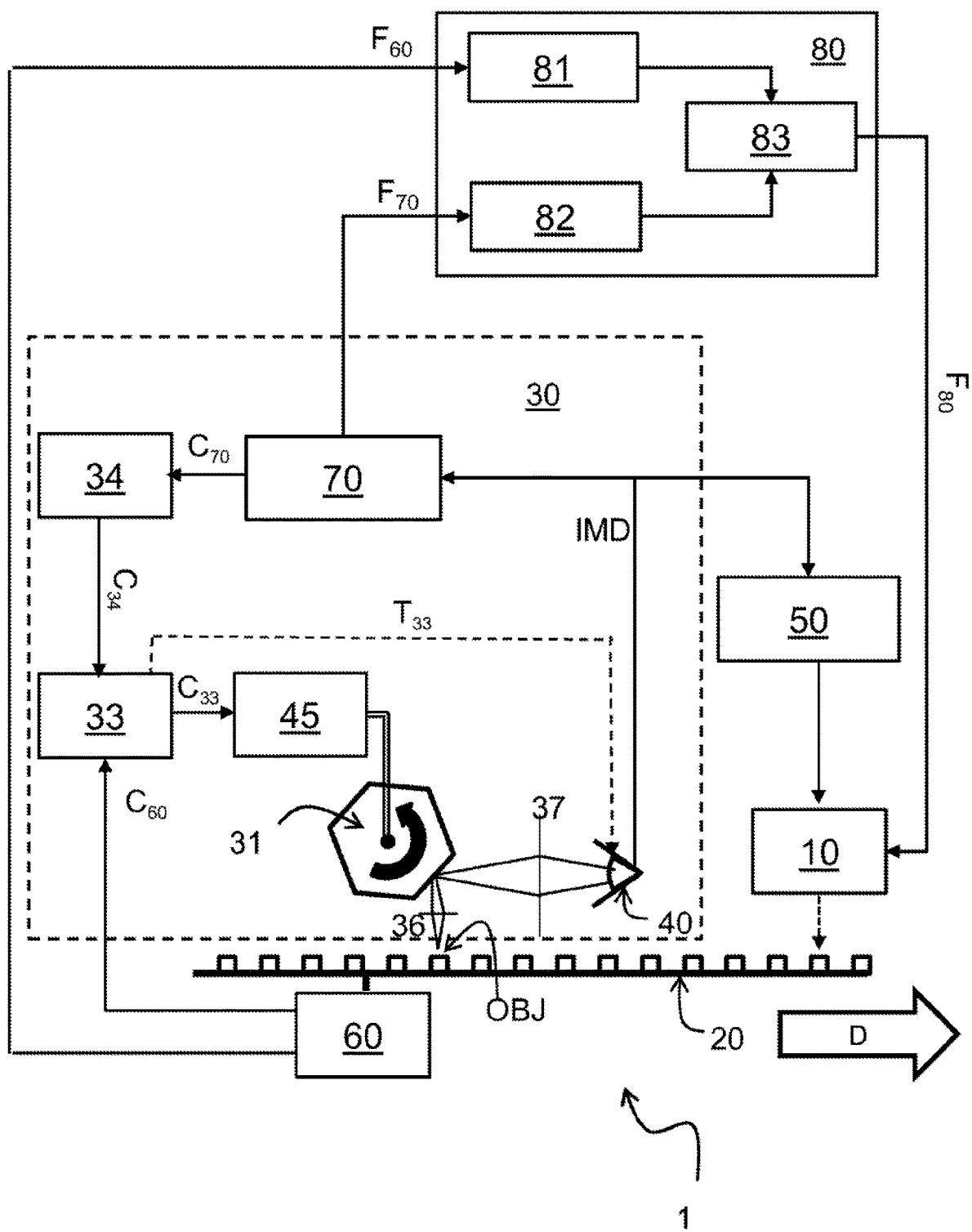
FIG. 5 shows a fifth embodiment of an improved physical object processing system.

Nevertheless, it may be contemplated to use a separate object detection unit 70 for this purpose, as shown for example in the embodiment of FIG. 5. The embodiment of FIG. 5 further comprises a rotation actuator 45 for the rotatable mirror 31 that is controlled by an actuator controller 33 that uses both a sense signal $C_{60}$ from the sensor 60 and an output signal $C_{70}$ from the separate object detection unit 70. The actuator controller also provides a trigger signal $T_{33}$ to the sensor 40. As shown further in FIG. 5 the separate object detection unit 70 and the speed sensor 60 each provide first and a second input clock signal $F_{70}$, $F_{60}$ respectively. Also a clock management unit 80 is included that an output clock signal $F_{80}$ on the basis of a low frequency component in the first input clock signal $F_{70}$ and a high frequency component in the second input clock signal $F_{60}$. Therewith an output clock signal $F_{80}$ can be obtained that is more accurate than each of the first and the second input clock signal. In the example shown, the low-frequency component of the first input clock signal $F_{70}$ is obtained with a low-pass filter having an above cut-off frequency with a predetermined frequency value and the high-frequency component of the second input clock signal $F_{60}$ is obtained with a high-pass filter having an below cut-off frequency with that same predetermined frequency value that is for example in the range of 100 Hz to a few hundreds of Hz, e.g. a predetermined frequency value of 200 Hz. It is not necessary that the filters have a very sharp roll-off characteristic, e.g. the low-pass filter and the high pass filter may for example have a first-order roll-off characteristic.

Whereas in the embodiment of FIG. 5 the optical image of the at least one physical object in the plane of the image sensor 40 is kept at an at least substantially fixed position by properly translating the sensor 40 and its optical system 37 with the actuator 45, it is alternatively to achieve this with a properly controlled rotatable mirror 31, as shown for example in FIGS. 1 and 2. In some embodiments measures may be contemplated to provide for an image stabilization in more than one direction, e.g. by using a pair of rotatable mirrors having a rotation axis in mutually different directions, by a means for translating the sensor independently in two directions or by a combination of such measures.

Figure 6:
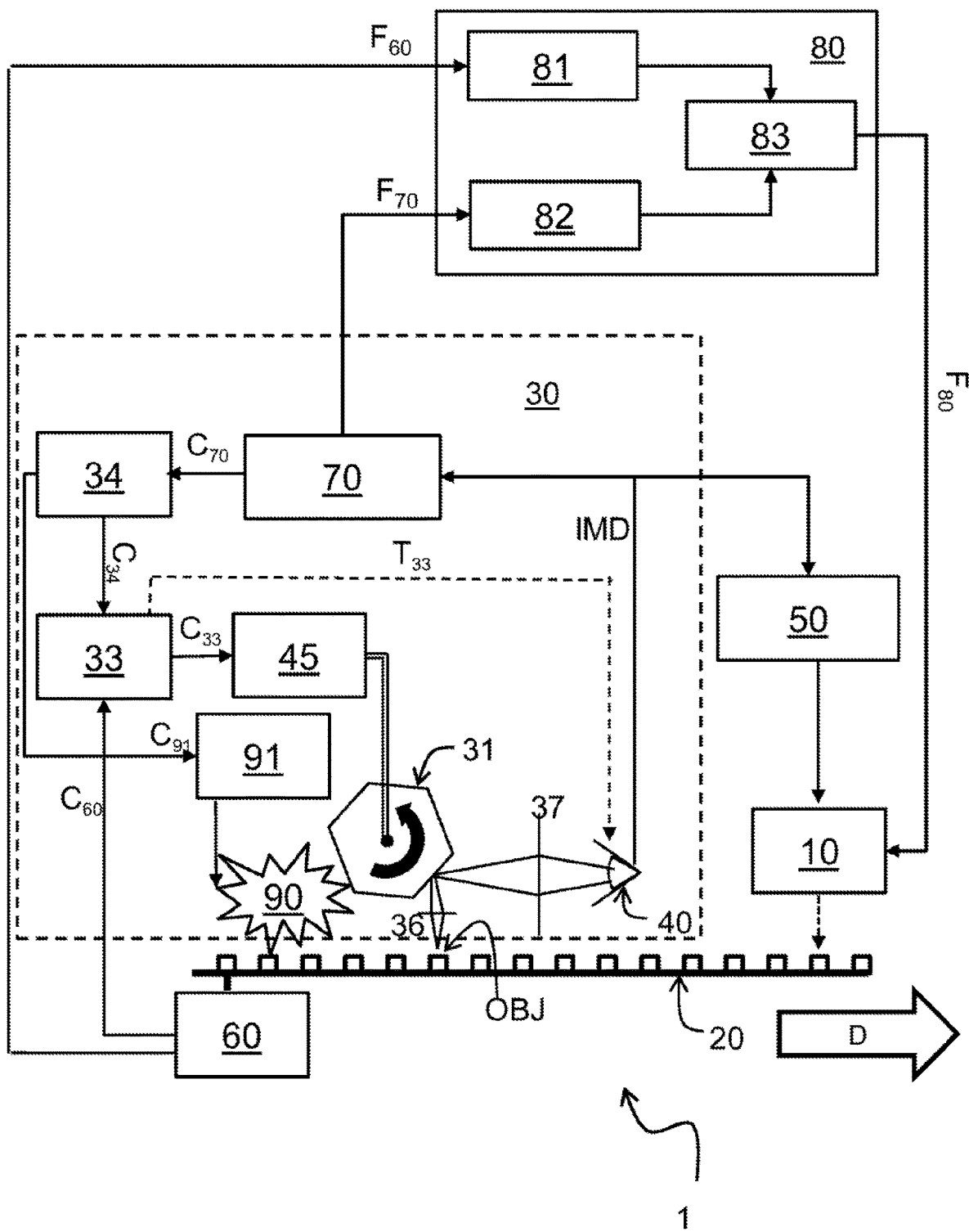
FIG. 6 shows a sixth embodiment of an improved physical object processing system.

FIG. 6 shows a still further embodiment of the physical object processing system 1 which differs from the previous embodiments in that it further comprises a flash illumination device 90 to illuminate the physical object OBJ with a single illumination pulse in order to form the optical image which is acquired as a digital image. The flash illumination device 90 has a driver 91 which is synchronized by a signal $C_{91}$ from the feedback unit 34. The synchronized flash illumination device 90 operates in synergy with the controlled translation actuator 45. For very high transportation speeds it may be the case that the controlled translation actuator 45 is not capable to fully compensate the motion of the transportation so that the image 42 of the object OBJ in the plane of the image sensor still moves, although with a speed that is substantially lower than in the absence of the controlled translation actuator. By illuminating the object with a single illumination pulse using the flash illumination device 90 the displacement of the image 42 of the object is minimized. It may also be contemplated to use the flash illumination device 90 for imaging without applying a motion compensation. Also in that case, for a modest transportation speed a digital image without motion blur can be obtained.

Figure 7:
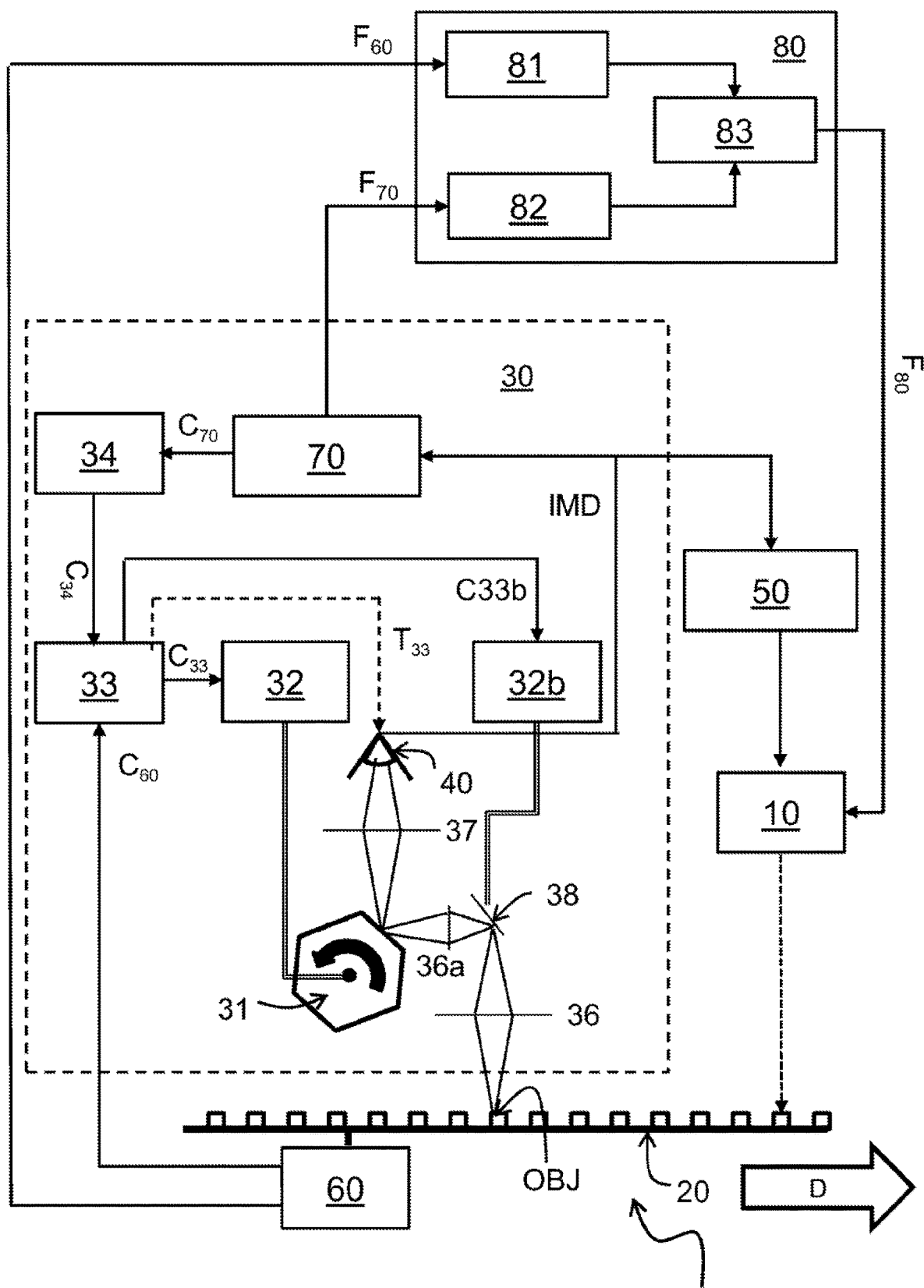
FIG. 7 shows a seventh embodiment of an improved physical object processing system.

FIG. 7 shows a seventh embodiment of an improved physical object processing system. In this embodiment, the optical imaging system comprises in addition to the rotatable mirror 31 a further rotatable mirror 38 which is actuated upon by a further actuator 32b. An image of the object OBJ is formed by an optical imaging path that subsequently comprises a first lens unit 36, the further rotatable mirror 38, a second lens unit 36a, the hexagonal rotatable mirror 31 and the third lens unit 37.

The further rotatable mirror 38 has a relatively low mass as compared to that of the hexagonal rotatable mirror 31. Therewith the hexagonal rotatable mirror 31 is particularly useful to provide for a course compensation of the movement of the objects and adapt to relatively low frequency variations therein, for example due to variations in the speed of the transport facility 20 for example. The further actuator 32b can adapt the rotational state of the further rotatable mirror 38 at a high speed to compensate for effects caused by vibrations, or by irregularities in the positioning of objects on the transport facility 20.

Figure 8:
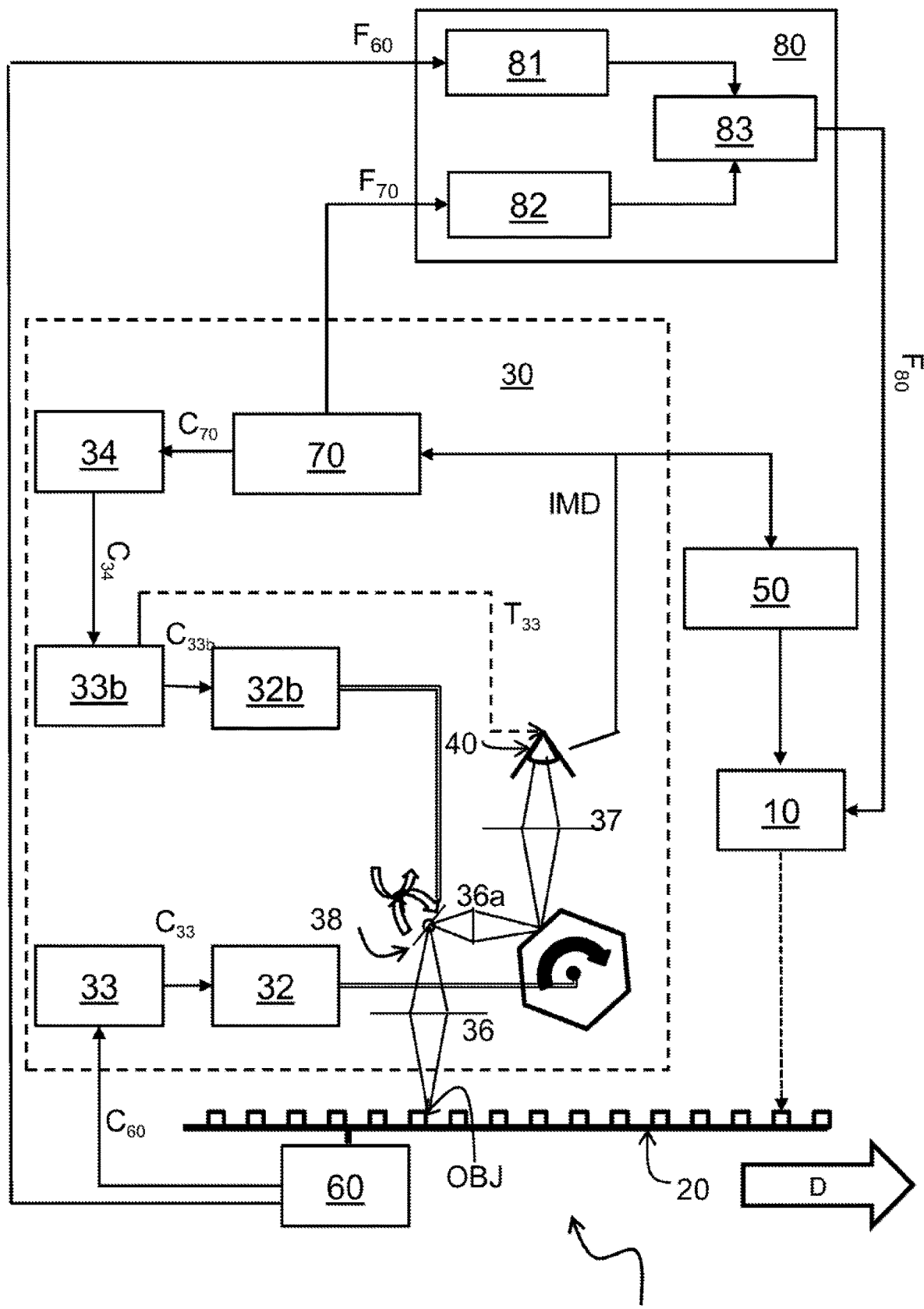
FIG. 8 shows an eighth embodiment of an improved physical object processing system.

FIG. 8 shows an eighth embodiment of an improved physical object processing system. As in the embodiment of FIG. 7, the optical imaging system comprises a further rotatable mirror 38 for high-speed compensation. In this embodiment, the actuator 32 of the rotatable hexagonal mirror 31 is controlled on the basis of an input signal $C_{60}$ from sensor 60, indicative for a transportation speed of transport facility 20. The actuator 32b that positions the further mirror 38 is controlled by controller 33b using a signal $C_{34}$ from the feedback unit 34 on the basis of the output signal $C_{70}$ of the object detection unit 70. The actuator 32b is configured to rotate the further mirror 38 in mutually orthogonal directions.

Figure 9:
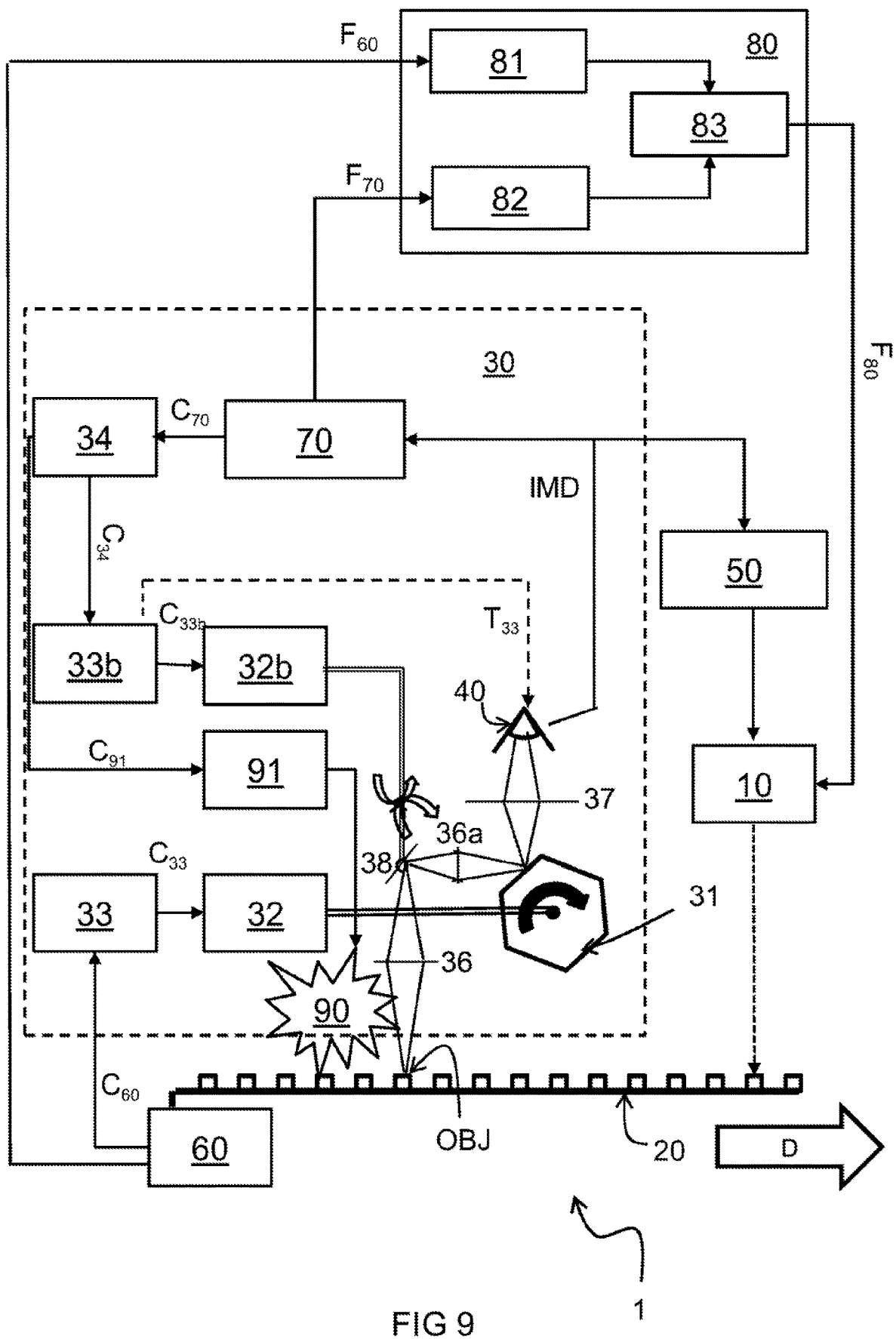
FIG. 9 shows a ninth embodiment of an improved physical object processing system.

FIG. 9 shows a ninth embodiment of an improved physical object processing system. This embodiment is further improved in comparison with the embodiment of FIG. 8, in that it comprises further a flash illumination device 90, to a physical object OBJ with a single illumination pulse in order to form the optical image which is acquired as a digital image. The flash illumination device 90 has a driver 91 which is controlled by a control signal $C_{34}$ from the feedback unit 34, using the output signal $C_{70}$ from object detection unit 70.

Figure 10:
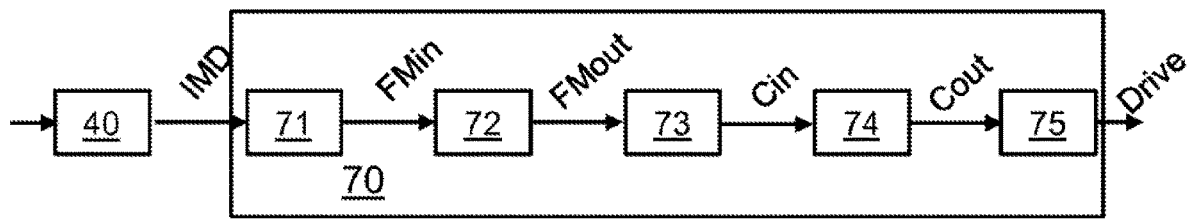
FIG. 10 shows in more detail an embodiment of image processing facilities in the improved physical object processing system.

FIG. 10 shows in more detail an embodiment of image processing and device control facilities in the improved physical object processing system. In the embodiment shown, the data process facilities 70 include a frame grabber 71, a accelerator memory 72, a data processing accelerator module 73 having parallel processing functionality, e.g. including at least a GPU (graphics processing unit) or another parallel processor, such as a FPGA (field programmable gate array), an Ethernet interface 74 and a driver 75.

In operation, the camera 40, e.g. an Optronis CP80 acquires the image data IMD at a framerate of e.g. 5 kHz and provides the image data e.g. via a CoaXPress-5 connection to the frame grabber 71. The frame grabber 71 uses DMA access to directly write the frame data into the accelerator memory 72. The data processing module 73 autonomously polls the accelerator memory 72 and performs image processing and device control algorithms. It has access to an Ethernet/EtherCAT driver and interface 74 to which it transmits device control information Cin. The data processing module 73 may use a PCIe3.0 bus for this purpose. The driver/interface 74 in turn sends control signals Cout to the driver 55, e.g. a 10 Gbs NIC, Mellanox Connectx4, for example as 2×45 byte datagrams. In response thereto, the driver 75 performs an A/D conversion and signal amplification required to drive components of the process station 10 with drive signals Drive. Due to the concurrency of various operations, parallel execution of the various algorithms, and due to the fact that the data processing module 73 that performs these algorithms has direct access to the image data, a very short latency, e.g. less than 500 µs, e.g. 200-300 µs can be achieved. The processing station 10 therewith is enabled to repetitively perform various operations at a high speed, e.g. >100 Hz, and with a high spatial accuracy, e.g. in the sub 10 µm range. Examples thereof are deposition on substrates, patterning of structures into substrates, placement of components on substrates and inspection of structures on substrates.

Figure 11:
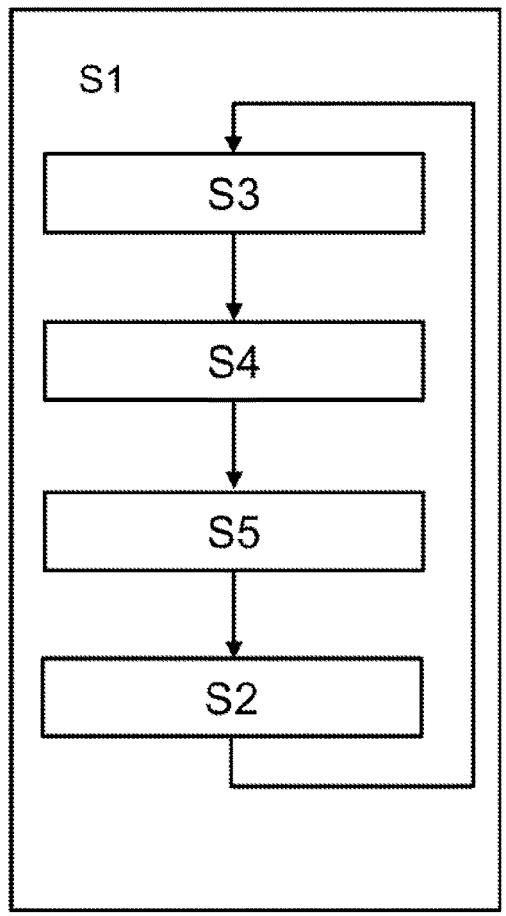
FIG. 11 shows an embodiment of an improved physical object processing method.

FIG. 11 shows a physical object processing method comprising the following steps:

The physical object is transported S1 along a processing location. At the processing location processing steps are performed S2 to the physical object. Typically, the physical object is one of a series of objects that are transported in a virtually continuous manner along various processing stations that perform various operations. Any means can be used for transporting the objects. A typical example thereof is a conveyor belt. While the object is transported, an optical image thereof is mapped S3 onto a reference plane mapping of an image sensor at an at least substantially fixed position during a time-interval for acquiring the digital image. In some embodiments a substantially fixed position of the optical image is achieved with a rotating mirror as shown in FIG. 1 and FIG. 2. As shown in FIGS. 7, 8 and 9, an imaging system may comprise a combination of rotatable imaging elements, wherein one e.g. a rotating polygonal mirror 31 thereof is actuated to provide for a relatively course motion compensation with a relatively slow response speed, whereas the other rotatable imaging element, a mirror 38 is provided to respond at a high speed, e.g. to compensate for relatively high frequent vibrations of the objects. A relatively lightweight rotatable imaging element may have a single degree of freedom to specifically provide compensation for movements associated with the transport direction, but may additionally have a further degree of freedom, to compensate for movements in an orthogonal direction. In other embodiments a substantially fixed position of the optical image is achieved with an actuator that moves the image sensor and its optical imaging system as shown in FIGS. 3, 4 and 5. In still further embodiments the substantially fixed position of the optical image is achieved with a flash illumination device that illuminates the physical object OBJ with a single illumination pulse. Even if the optical image moves in the plane of the image sensor its displacement during the single illumination pulse is small, so that it can be considered as having a substantially fixed position. As shown in FIG. 6, this measure can be combined in a synergic manner with other measures that aim to minimize a speed of movement of the object image. An input signal for controlling a mirror actuator 32, an image sensor actuator 45 or a flash illumination unit 90 may be provided by one or more of a sensor 60 that senses position, speed and/or acceleration of the transport facility 20 (See, FIG. 1, 3, 5, 6) and an object detection unit (See FIG. 2, 4, 5).

The image sensor acquires S4 a digital image IMD that represents the optical image in its reference plane. The digital image IMD is digitally processed S5 to generate control data to control the processing steps to be performed in step S2. A digital image processing system 50 used for this purpose may also provide a control signal for a mirror actuator 32 (see e.g. FIG. 2), an image sensor actuator 45 (See e.g. FIG. 4) or a flash illumination unit 90. Alternatively, a separate object detection unit 70 may be used for that purpose, see e.g. FIG. 5. The blocks indicating steps S2-S5 are position inside the block S1 to indicate that all these steps are performed while the objects are transported.

The invention claimed is:

1. A physical object processing system comprising:
   a process station configured to perform processing steps to at least one physical object;
   a transport facility configured to transport the at least one physical object along the process station;
   an optical imaging system configured to map an optical image of the at least one physical object onto an image sensor configured to acquire a digital image from the optical image;
   data process facilities configured to process the digital image and to control the process station in accordance with the data processing facilities processing the digital image;
   wherein the optical imaging system is configured to map the optical image of the at least one physical object onto the image sensor at an at least substantially fixed position during a time-interval for acquiring the digital image,
   wherein the optical imaging system comprises:
     a rotatable mirror,
     a mirror rotation actuator to rotate the rotatable mirror, and
     an actuator controller that controls the mirror rotation actuator in accordance with a speed with which the at least one physical object moves, and
   wherein the physical object processing system further comprises:
     an object detection unit configured to generate an output signal indicative for a displacement speed of the optical image of the at least one physical object mapped onto the image sensor, and
     a feedback unit configured to use the output signal to enable the actuator controller to minimize the displacement speed.

2. The physical object processing system according to claim 1, wherein the rotatable mirror is a polygonal mirror.

3. The physical object processing system according to claim 1, wherein the object detection unit is further configured to generate an output signal with an indication for a mapping location of the optical image of the at least one physical object, and
wherein the feedback unit is configured to use the output signal with an indication for a mapping location of the optical image to enable the actuator controller to minimize a deviation of the mapping location from a predetermined mapping location.

4. The physical object processing system according to claim 3, where the optical imaging system comprises, in addition to the rotatable mirror, a further rotatable mirror controlled by a further mirror actuator,
wherein the further mirror actuator, controlled by a further controller, is configured to control the further rotatable mirror as part of a feedback path having a relatively high response speed as compared to a response speed of a part of a feedback path comprising the rotatable mirror,
wherein the actuator controller operates on the basis of an input signal from a sensor to provide to the actuator controller a sense signal indicative of one or more of the group of parameters consisting of: a position, an angle, and derivatives of the position and the angle of the transport facility, and
wherein the further controller operates on the basis of an input signal from the feedback unit.

5. The physical object processing system according to claim 4, where the further mirror actuator is configured to correct for errors in:
a same direction as the mirror actuator, and
a second direction perpendicular to the same direction as the mirror actuator.

6. The physical object processing system according to claim 1, wherein the actuator controller is configured to provide an image sensing trigger signal that indicates a time interval, and
wherein the optical imaging system is capable to map a stable optical image of the at least one object.

7. The physical object processing system according to claim 4, wherein the object detection unit provides a first input clock signal and the speed sensor provides a second input clock signal,
wherein the physical object processing system further comprises a clock management unit that generates an output clock signal on the basis of a low frequency component in the first input clock signal and a high frequency component in the second input clock signal.

8. The physical object processing system according to claim 1, wherein the processing station comprises equipment for repetitively performing one or more operation taken from the group consisting of:
deposition on substrates,
patterning of structures into substrates,
placement of components on substrates,
inspection of structures on substrates, and
picking of dies from wafers.

9. The physical object processing system according to claim 1, further comprising a flash illumination device configured to illuminate the at least one physical object with a single illumination pulse to form the optical image that is acquired as a digital image.

10. The physical object processing system according to claim 1, wherein the data process facilities comprise:
a frame grabber configured to store frame data in an accelerator memory,
a data processing module having parallel processing functionality with direct access to the accelerator memory, and
a driver controlled by the data processing module to generate drive signals for the process station.

11. A physical object processing method comprising:
transporting at least one physical object along a processing location;
performing, at the processing location, processing steps to the at least one physical object;
mapping, in a reference plane, an optical image of the at least one physical object during the transporting;
acquiring a digital image representing the optical image in the reference plane;
digitally processing the digital image to generate control data to control the processing steps in accordance with the data processing facilities processing the digital image;
mapping, with an optical imaging system, the optical image at an at least substantially fixed position in the reference plane during a time-interval for acquiring the digital image,
wherein the optical imaging system comprises:
a rotatable mirror,
a mirror rotation actuator to rotate the rotatable mirror, and
an actuator controller;
wherein the actuator controller controls the mirror rotation actuator in accordance with a speed with which the at least one physical object moves;
wherein the method comprises generating, with an object detection unit, an output signal indicative for a displacement speed of the optical image of the at least one physical object mapped onto the image sensor; and
wherein a feedback unit uses the output signal to enable the actuator controller to minimize the displacement speed.

12. The physical object processing system according to claim 2, wherein the actuator controller is configured to provide an image sensing trigger signal that indicates a time interval wherein the optical imaging system is able to map a stable optical image of the at least one object.

13. The physical object processing system according to claim 3, wherein the actuator controller is configured to provide an image sensing trigger signal that indicates a time interval wherein the optical imaging system is able to map a stable optical image of the at least one object.

14. The physical object processing system according to claim 4, wherein the actuator controller is configured to provide an image sensing trigger signal that indicates a time interval wherein the optical imaging system is able to map a stable optical image of the at least one object.

15. The physical object processing system according to claim 5, wherein the actuator controller is configured to provide an image sensing trigger signal that indicates a time interval wherein the optical imaging system is able to map a stable optical image of the at least one object.

16. The physical object processing system according to claim 2, wherein the processing station comprises equipment for repetitively performing one or more operation taken from the group consisting of:
- deposition on substrates,
- patterning of structures into substrates,
- placement of components on substrates,
- inspection of structures on substrates, and
- picking of dies from wafers.

17. The physical object processing system according to claim 3, wherein the processing station comprises equipment for repetitively performing one or more operation taken from the group consisting of:
- deposition on substrates,
- patterning of structures into substrates,
- placement of components on substrates,
- inspection of structures on substrates, and
- picking of dies from wafers.

18. The physical object processing system according to claim 6, wherein the processing station comprises equipment for repetitively performing one or more operation taken from the group consisting of:
- deposition on substrates,
- patterning of structures into substrates,
- placement of components on substrates,
- inspection of structures on substrates, and
- picking of dies from wafers.

19. The physical object processing system according to claim 8, further comprising a flash illumination device configured to illuminate the at least one physical object with a single illumination pulse to form the optical image that is acquired as a digital image.

20. The physical object processing system according to claim 8, wherein the data process facilities comprise:
- a frame grabber configured to store frame data in an accelerator memory,
- a data processing module having parallel processing functionality with direct access to the accelerator memory, and
- a driver controlled by the data processing module to generate drive signals for the process station.

* * * * *